(12) United States Patent
Sakurai et al.

(10) Patent No.: US 6,350,549 B1
(45) Date of Patent: Feb. 26, 2002

(54) JIG FOR PRODUCING PELLICLE AND METHOD FOR PRODUCING PELLICLE USING THE SAME

(75) Inventors: Ikuo Sakurai; Meguru Kashida, both of Gunma-ken (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 0 days.

(21) Appl. No.: 09/375,746

(22) Filed: Aug. 17, 1999

(30) Foreign Application Priority Data

Aug. 19, 1998 (JP) .............................................. 10-249151

(51) Int. Cl.[7] ................................................. G03F 9/00
(52) U.S. Cl. .............................................. 430/51; 428/14
(58) Field of Search .................................. 430/5; 428/14

(56) References Cited

U.S. PATENT DOCUMENTS

| | | | | |
|---|---|---|---|---|
| 5,061,024 A | * | 10/1991 | Keys | 359/350 |
| 5,168,993 A | * | 12/1992 | Yen | 206/316.1 |
| 5,772,817 A | * | 6/1998 | Yen et al. | 156/73.1 |
| 5,834,143 A | * | 11/1998 | Matsuoka et al. | 430/5 |
| 6,149,992 A | * | 11/2000 | Nakayama | 428/14 |

* cited by examiner

*Primary Examiner*—Mark F. Huff
*Assistant Examiner*—Saleha R. Mohamedulla
(74) *Attorney, Agent, or Firm*—Hogan & Hartson, L.L.P.

(57) ABSTRACT

There is disclosed a jig for producing a pellicle comprising a support frame having an opening, and an adhesive layer provided at periphery of the opening, wherein the adhesive layer is composed of a polymer material having a glass transition temperature within a range of 0° C. to 300° C. The jig of the present invention can be repeatedly used without reforming the adhesive layer after use.

12 Claims, 3 Drawing Sheets

(a)

JIG FOR PRODUCING PELLICLE AND METHOD FOR PRODUCING PELLICLE USING THE SAME

BACKGROUND OF THE INVENTION

1. Field of the Invention

The present invention relates to a jig for producing a pellicle for use in photolithography, which pellicle is used as dust-proof protection of light-exposure originals having patterns in photolithographic patterning work in the production of semiconductor devices such as LSIs and VLSIs, liquid-crystal display devices and the like, and a method for producing a pellicle using the jig.

2. Description of the Related Art

In the fabrication of semiconductor devices, such as LSIs and VLSIs, and liquid-crystal display devices, a process comprising placing a light-exposure original (this term is herein used to collectively refer to photomasks, reticles and the like), and light-exposing the light-exposure original to transfer a pattern by the light transmitted through the original, i.e., photolithography, has been utilized.

However, if the light-exposure original used in such a process carries dust particles deposited thereon, the light beam is unevenly absorbed or scattered by the dust particles so that the pattern transferred on a semiconductor wafer, liquid crystal device substrate and the like may be deformed, the edge lines of a patterned area may be rugged without smoothness, or a white portion may be stained black. Thus, dimension, quality, appearance and the like of the pattern are disadvantageously degraded, and as a result, performance and production yield of semiconductor devices, liquid crystal display devices and the like may be degraded.

To obviate such a problem, the photolithography process is usually performed in a clean room. However, it is difficult to keep the light-exposure original in a perfectly dust-free condition even in a clean room. Therefore, to prevent the adhesion of dust particles and the like onto the light-exposure original surface, a transparent pellicle sufficiently transmitting the light for the light exposure is applied on the original.

When a pellicle is applied, dust particles are not adhered directly on the light-exposure original surface but on the pellicle membrane. Therefore, if the light is focused on the pattern of the light-exposure original during the photolithography process, the presence of such dust particles does not influence on the pattern transfer, and thus the aforementioned problem is not caused.

The aforementioned pellicle is produced by spreading a pellicle membrane on a pellicle frame, and the outline of the production method therefor is as follows.

First, a pellicle membrane is formed by solution casting or the like on a substrate composed of silicon single crystal, synthetic quartz or the like using a material sufficiently transmitting light, for example, cellulose nitrate, cellulose acetate, fluorocarbon resin, and the like.

Then, a jig for producing a pellicle comprising a support frame having an opening at its center, and an adhesive layer provided around the opening is used to adhere the pellicle membrane on the adhesive layer, and separate the jig from the substrate. As a result, the pellicle membrane is peeled off from the substrate and held on the adhesive layer of the jig for producing a pellicle.

Thereafter, a pellicle frame is adhered to this pellicle membrane, and a pellicle is produced by trimming the pellicle membrane along the outer periphery of the pellicle frame.

The adhesive layer of the jig for producing a pellicle used for the above production process is usually composed of a double-sided adhesive tape, or prepared from an adhesive such as acrylic resin and epoxy resin.

However, when a double-sided adhesive tape or an adhesive such as acrylic resin and epoxy resin is used as the aforementioned adhesive layer as mentioned above, an unnecessary pellicle membrane remains on the adhesive layer after a pellicle is once produced, and therefore the adhesion of the surface of adhesive layer is lost. Accordingly, it cannot be used as the adhesive layer again as it is. Therefore, in order to use this jig for producing a pellicle again, it is necessary to remove the adhesive layer after use, and form another adhesive layer again. However, such formation of adhesive layer is not preferred in view of production efficiency since it takes time, and it also suffers from the problem of increase of the cost for the adhesive layer.

Therefore, jigs for producing a pellicle have sometimes been disposed after they were used once. Although such a method may in fact save time and labor, it still disadvantageously suffers from the problem concerning the production cost.

SUMMARY OF THE INVENTION

The present invention has been accomplished in view of the aforementioned problems, and its major object is to provide a jig for producing a pellicle which can be repeatedly used without reforming the adhesive layer after use, and a method for producing a pellicle using it. In order to achieve the aforementioned object, the present invention provides a jig for producing a pellicle comprising a support frame having an opening, and an adhesive layer provided at periphery of the opening, characterized in that the adhesive layer is composed of a polymer material having a glass transition temperature within a range of 0° C. to 300° C.

The adhesive layer composed of a polymer material having a glass transition temperature within a range of 0° C. to 300° C. can be adhered to the pellicle membrane when it is softened or melted by heating to a temperature higher than its glass transition temperature, and contacted with a pellicle membrane. Further, though the adhesive layer would have an unnecessary pellicle membrane thereon after once producing a pellicle, the adhesive layer having the unnecessary pellicle membrane can be adhered again to another new pellicle membrane when it is softened or melted again as it is by heating, and contacted with the new pellicle membrane. This makes it possible to repeatedly use the jig without reproducing the adhesive layer, and thus reduction of time and cost required for the production of pellicle can be realized.

In the jig of the present invention, the polymer material used for the adhesive layer is selected so that a value obtained by subtracting a glass transition temperature of the polymer material of the adhesive layer from a glass transition temperature of a polymer material of the pellicle membrane used for the pellicle to be produced should be less than 60° C.

When the value obtained by subtracting a glass transition temperature of the polymer material of the adhesive layer from a glass transition temperature of polymer material for the pellicle membrane is 60° C. or more, the glass transition temperature of the adhesive layer substantially approaches room temperature, and hence its handling becomes difficult. Moreover, in such a case, when the pellicle membrane is heated to a temperature more than its glass transition temperature, the rigidity of the adhesive layer is reduced, and hence it may be likely that wrinkles are generated in the pellicle membrane due to decrease of its tension when it is peeled off from the substrate and transferred to the adhesive layer. For these reasons, the above mentioned value is defined.

Further, in the jig of the present invention, it is desirable that the polymer material of the adhesive layer should be a polymer material having compatibility with the polymer material of the pellicle membrane.

This is because the polymer material of the adhesive layer and the polymer material of the pellicle membrane exhibiting compatibility with each other can be easily adhered when they are heated and contacted with each other, and the adhesion strength obtained by the thermal adhesion also becomes higher.

In such a case, it is preferred that the polymer material of the adhesive layer should be the same material as the polymer material of the pellicle membrane.

The use of the same materials is advantageous in view of the adhesion because the adhesive layer and the pellicle membrane can be softened and melted by simultaneous heating. In addition, it is also advantageous in view of the repetitive use of the adhesive layer, because the adhesive layer surface can be the same material as the original material after the repetitive use, and hence the condition for adhesion can be constant.

Further, in the jig of the present invention, it is desirable that the polymer material of the adhesive layer should be a fluorocarbon resin.

In recent years, use of light having a wavelength of 248 nm of krypton fluoride excimer laser and light having a wavelength of 193 nm of argon fluoride excimer laser in the light exposure process of the semiconductor production becomes popular, and fluorocarbon resins well transmitting these lights are often used as a material of pellicle membrane. However, fluorocarbon resins do not show good adhesion with other kinds of resins. Therefore, when the material of the pellicle membrane is a fluorocarbon resin, it is desirable that the material of the adhesive layer should also be a fluorocarbon resin.

The present invention also provides a method for producing a pellicle, characterized in that it comprises the steps of forming a pellicle membrane; adhering the formed pellicle membrane to the adhesive layer of the aforementioned jig for producing a pellicle according to the present invention by heating the pellicle membrane and/or the adhesive layer to a temperature more than their glass transition temperatures and contacting them with each other, so that the pellicle membrane should be held on the adhesive layer; adhering a pellicle frame on the pellicle membrane held on the adhesive layer; and trimming the pellicle membrane along outer periphery of the pellicle frame.

By producing pellicles using the aforementioned jig for producing a pellicle, the production efficiency can be improved because the jig for producing a pellicle can be repeatedly used.

The jig for producing a pellicle of the present invention comprises a support frame having an opening, and an adhesive layer provided at periphery of the opening, and is characterized in that the adhesive layer is composed of a polymer material having a glass transition temperature within a range of 0° C. to 300° C. Therefore, the adhesive layer can be softened or melted by heating it to a temperature higher than its glass transition temperature, and brought into contact with a pellicle membrane to achieve adhesion with the pellicle membrane. Further, though the adhesive layer would have an unnecessary pellicle membrane thereon after once producing a pellicle, it can be adhered again to another new pellicle membrane for producing another pellicle when it is softened or melted again as it is by heating and contacted with the new pellicle membrane. This makes it possible to repeatedly produce pellicles without reproducing the adhesive layer of the jig, and thus reduction of time and cost required for the production of pellicle can be realized.

DESCRIPTION OF THE INVENTION AND EMBODIMENTS

Embodiments of the present invention will be explained hereinafter, but the present invention is not limited to them.

Figure 1:
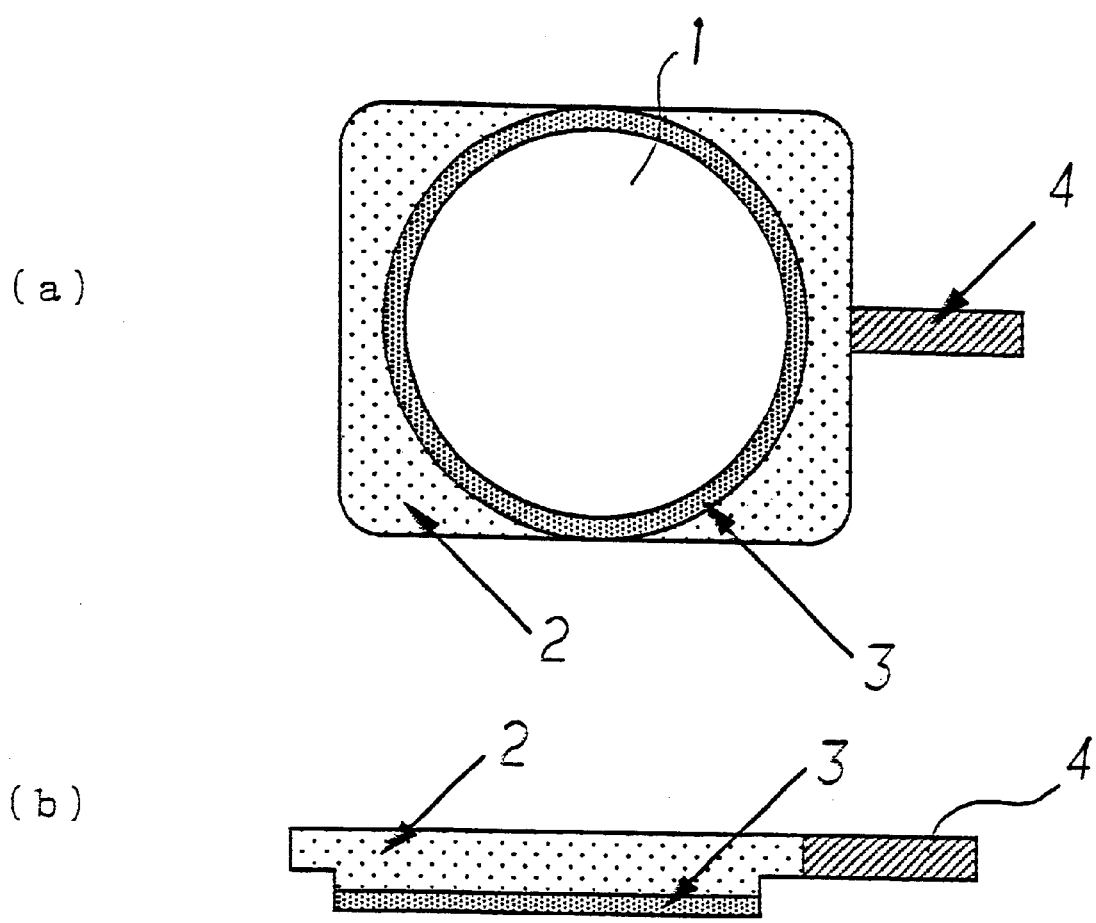
FIG. 1 shows an exemplary jig for producing a pellicle of the present invention. (a) is a schematic plan view thereof, and (b) is a schematic side view thereof.
Figure 2:
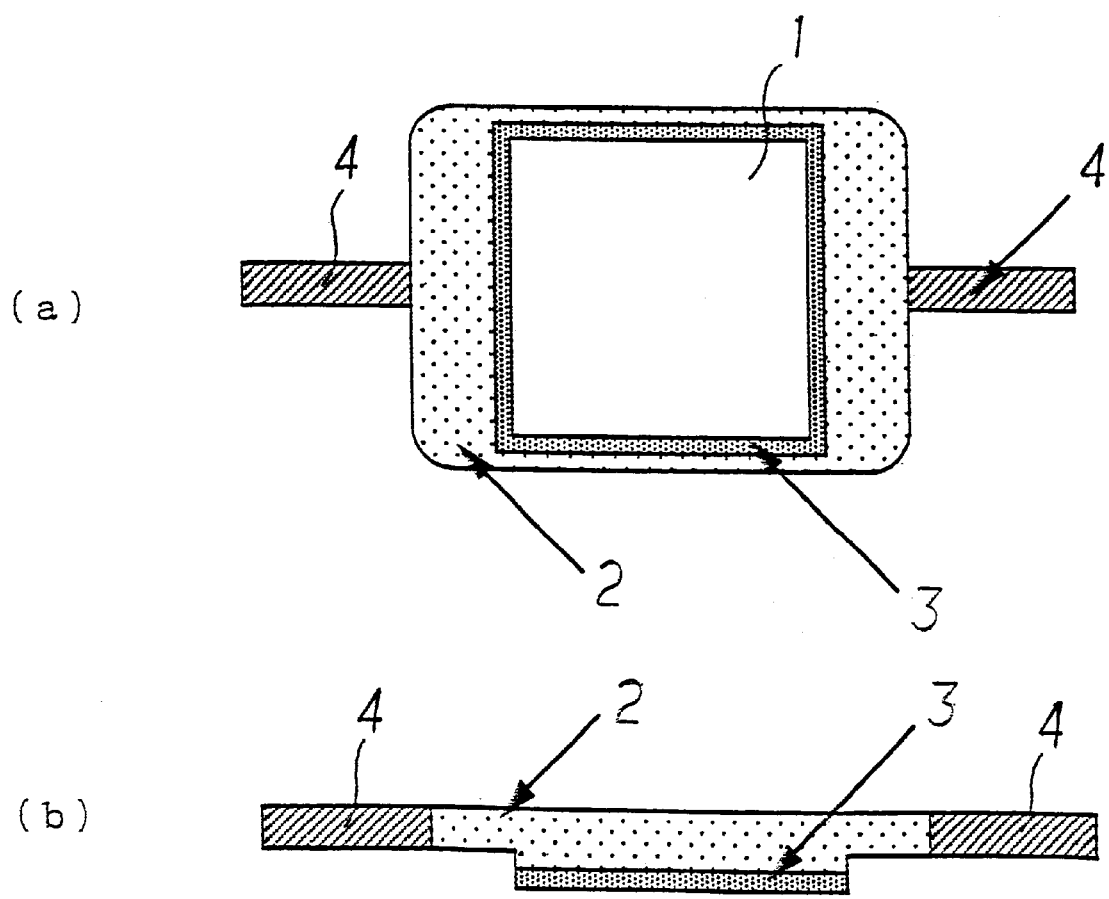
FIG. 2 shows another exemplary jig for producing a pellicle of the present invention. (a) is a schematic plan view thereof, and (b) is a schematic side view thereof.

The jig for producing a pellicle of the present invention comprises a support frame 2 having an opening 1, and an adhesive layer 3 provided at the periphery of this opening 1 as shown in FIGS. 1 and 2, for example. In order to make easy the handling of the jig for producing a pellicle at the time of separation of the jig from a substrate, a handle 4 may be provided.

The plan shape of the support frame 2 is not particularly limited, and it may be, for example, in a rectangular shape as shown in FIG. 1, or may be a circular shape or the like.

The kind of the material for the support frame 2 is not also particularly limited so long as it has certain rigidity. For example, it can be made of metals such as stainless steel and aluminum, ceramics such as silicon nitride and silicon carbide, plastics such as polyimide, polycarbonate, and polytetrafluoroethylene and the like.

The opening 1 provided in the support frame 2 is required when a pellicle frame is adhered to the pellicle membrane, while the pellicle membrane is adhered and held on the adhesive layer 3. Its shape is not particularly limited, and it may have a circular shape as shown in FIG. 1, or it may have a square shape as shown in FIG. 2.

On the support frame 2 around the opening 1, the adhesive layer 3 for adhering and holding the pellicle membrane is provided as described above. This adhesive layer 3 may be formed directly on the support frame 2, or, when the adhesion of the material of the support frame 2 for the material of adhesive layer 3 is poor, the support frame 2 and the adhesive layer 3 may be adhered with each other via a binder layer. Such a binder layer may be composed of a single layer, or a plurality of binder layers may also be provided.

The characteristic of the present invention resides in that the adhesive layer provided at the periphery of the opening is composed of a polymer material having a glass transition temperature within a range of 0° C. to 300° C.

When the adhesive layer is formed from a polymer material having a glass transition temperature within a range of 0° C. to 300° C. as described above, the adhesive layer can be adhered by fusion to the pellicle membrane by heating it to a temperature higher than its glass transition temperature, contacting it with the pellicle membrane, and pressing them. Further, though the adhesive layer would have an unnecessary pellicle membrane thereon after once a pellicle is produced, the adhesive layer having the unnecessary pellicle membrane as it is can be adhered again to another new pellicle membrane when it is softened or melted again by heating and contacted with the new pellicle membrane. This makes it possible to repeatedly produce a pellicle without reproducing the adhesive layer.

The glass transition temperature is defined to be within the range of 0° C. to 300° C., because a temperature higher than 300° C. may degrade the adhesive layer and the pellicle membrane upon heating, and a glass transition temperature lower than 0° C., which means room temperature exceeds the glass transition temperature, affords low rigidity of the adhesive layer, which may cause various problems such as generation of wrinkles of pellicle membrane when the pellicle is spread.

According to the present invention, a more preferred range of the glass transition temperature is 50° C. to 200° C., and a particularly preferred range is 0° C. to 150° C.

Further, it is preferred that the polymer material used for the adhesive layer should be selected so that a value obtained by subtracting a glass transition temperature of the polymer material of the adhesive layer from a glass transition temperature of a polymer material of the pellicle membrane should be less than 60° C.

When the value obtained by subtracting the glass transition temperature of polymer material for the adhesive layer from the glass transition temperature of polymer material for the pellicle membrane is 60° C. or more, the glass transition temperature of the adhesive layer substantially approaches room temperature, and hence the adhesive layer may be softened or melted even at room temperature, which may be disadvantageous in view of rigidity of the adhesive layer.

Moreover, in such a case, when the adhesive layer and the pellicle membrane is heated to a temperature more than the glass transition temperature of the pellicle membrane, the temperature of the adhesive layer may become considerably higher than its glass transition temperature, and hence the rigidity of the adhesive layer may be markedly decreased. Therefore, it may become likely that wrinkles are generated in the pellicle membrane due to decrease of its tension when it is peeled off from the substrate and transferred onto the adhesive layer. Also for this reason, it is preferred that the value obtained by subtracting the glass transition temperature of polymer material for the adhesive layer from the glass transition temperature of polymer material for the pellicle membrane should be 60° C. or less.

The glass transition temperature used for the present invention is represented by a value measured by a differential scanning calorimeter (DSC).

The polymer material of the adhesive layer is preferably a polymer material having compatibility with the polymer material of the pellicle membrane to be adhered. This is because the polymer material of the adhesive layer and the polymer material of the pellicle membrane exhibiting compatibility with each other can be easily adhered when they are heated and contacted with each other, and they afford improved adhesion strength.

More preferably, the polymer material of the adhesive layer should be the same material as the polymer material of the pellicle membrane.

The use of the same materials is advantageous in view of the adhesion because the adhesive layer and the pellicle membrane can be softened and melted by simultaneous heating. In addition, it is also advantageous in view of the repetitive use of the adhesive layer, because the adhesive layer surface can be the same material as the original material after the repetitive use, and hence the condition for adhesion can be constant.

Further, the polymer material of the adhesive layer is desirably a fluorocarbon resin, though it is not particularly limited.

In recent years, use of light having a wavelength of 248 nm of krypton fluoride excimer laser and light having a wavelength of 193 nm of argon fluoride excimer laser in the light exposure process of the semiconductor production becomes popular, and fluorocarbon resins well transmitting these lights are often used as a material of pellicle membrane. However, fluorocarbon resins do not show good adhesion with other kinds of resins. Therefore, when the material of the pellicle membrane is a fluorocarbon resin, it is desirable that the material of the adhesive layer should also be a fluorocarbon resin.

Particularly preferred examples of the fluorocarbon resin include, for example, amorphous fluorocarbon polymers, for example, copolymers of tetrafluoroethylene and vinylidene fluoride, ternary copolymers of tetrafluoroethylene, hexafluoropropylene, and vinylidene fluoride, copolymers of tetrafluoroethylene and a fluorine-containing monomer having a cyclic perfluoroether group and the like.

Because the polymer material of the adhesive layer according to the present invention must be adhered to the pellicle membrane by heating it to a temperature higher than its glass transition temperature, and bringing it into contact with the pellicle membrane, and pressurizing them, it is preferably a polymer material which exhibits a melted state to some extent, and hence exhibits adhesion at its surface when it is heated to a temperature higher than its glass transition temperature.

Now, the method for producing a pellicle using the aforementioned jig for producing a pellicle will be explained.

In the method for producing a pellicle of the present invention, a pellicle membrane is formed first. The pellicle membrane can be formed by, for example, forming a membrane by the solution casting on a substrate composed of silicon single crystal, synthetic quartz or the like. That is, the membrane can be formed by, for example, coating a solution comprising a material for the pellicle membrane added with a solvent to adjust to a concentration of 1–20% by weight on a substrate surface by a spin coater, knife coater or the like.

The polymer material used for the pellicle membrane preferably has a glass transition temperature of 0° C. to 300° C., like the polymer material of the adhesive layer. Since the adhesive layer surface of the jig for producing a pellicle once undergone the pellicle production should have an unnecessary pellicle membrane, the adhesion of the adhesive layer and the pellicle membrane on and after the 2nd pellicle production becomes adhesion between pellicle membranes. Therefore, the pellicle membrane must also be composed of a material that is softened and melted upon heating like the adhesive layer. Accordingly, the polymer material used for the pellicle membrane preferably has a glass transition temperature of 0° C. to 300° C. as mentioned above. More preferred glass transition temperature range of the polymer material of the pellicle membrane is 50° C. to 200° C., particularly preferably 80° C. to 150° C., like the adhesive layer.

As mentioned above, use of krypton fluoride excimer laser and argon fluoride excimer laser becomes popular in the light exposure process of the semiconductor production in recent years. Therefore, fluorocarbon resins well transmitting these lights are preferably used. Among such resins, preferred are amorphous fluorocarbon polymers such as cyclic polymers of perfluorovinyl ether, copolymers of tetrafluoroethylene and perfluorodioxol, and ternary copolymers of tetrafluoroethylene, hexafluoropropylene, and vinylidene fluoride.

The pellicle membrane to be formed generally has a thickness within the range of 0.1–10 μm, preferably 0.5–5 μm in view of the balance of mechanical strength and permeability. The pellicle membrane desirably exhibits light permeability of 95% or more, more preferably 98% or more for practical use.

Subsequently, either or both of the adhesive layer and pellicle membrane are heated to a temperature higher than their glass transition temperatures.

According to the present invention, one of the adhesive layer and the pellicle membrane may be heated to a temperature higher than its glass transition temperature. This is because the adhesive layer and the pellicle membrane can be adhered with each other by making one of them into a softened or melted state, contacting them with each other and pressing them. However, it is desirable to heat both of the adhesive layer and the pellicle membrane to a temperature higher than their glass transition temperatures because the contact and pressing can be completed within a short period of time, and high adhesion strength can be obtained by doing so.

Further, on and after the 2nd pellicle production, the adhesive layer surface of the jig for producing a pellicle would have a pellicle membrane, and hence the adhesion of the adhesive layer and the pellicle membrane becomes adhesion between pellicle membranes. Therefore, the heating is preferably performed at least to a temperature higher than the glass transition temperature of the polymer material of the pellicle membrane.

The temperature higher than a glass transition temperature is not particularly limited so long as it is higher than the glass transition temperature. However, at a temperature close to the glass transition temperature, the softened or melted state of the pellicle membrane and the adhesive layer may be insufficient, and it may takes an extremely long period of time to complete the adhesion . On the other hand, at a temperature considerably higher than the glass transition temperature, rigidity of the adhesive layer may markedly decrease to promote deformation of the adhesive layer, and hence correction of adhesive layer deformation may be frequently required.

Therefore, while it is necessary to select a suitable temperature depending on the material, the temperature is generally higher than the glass transition temperature by 20° C. to 180° C., preferably 40° C. to 150° C.

The method for heating the adhesive layer and the pellicle membrane used for the present invention is not particularly limited, and it can be performed by contact heating with a hot plate etc., infrared heating, high frequency induction heating, warm air heating or the like.

Then, the adhesive layer and the pellicle membrane of the jig for producing a pellicle, which were heated, are brought into contact with each other for adhesion. In order to complete the adhesion within a short period of time and to increase adhesion strength, they are preferably pressurized while they are contacted with each other. While the pressurization may be achieved by, for example, loading the weight of the jig for producing a pellicle itself, a method utilizing externally applied pressure, i.e., a method comprising applying pressure to the support frame and the substrate, is preferred in order to complete the adhesion as fast as possible.

The magnitude of pressure and time for applying pressure can be suitably selected considering adhesion between the adhesive layer and the pellicle membrane and the like.

After completion of the adhesion, the pellicle membrane is peeled off from the substrate by separating the support flame from the substrate, and the pellicle membrane is adhered to and held on the adhesive layer of the support frame. The pellicle membrane is peeled off from the substrate, for example, in a cantilever fashion by applying force to one point of the support frame, applying force to two points of the support frame, or the like.

Then, a pellicle frame is adhered to the pellicle membrane peeled from the substrate and adhered to and held on the adhesive layer.

The pellicle frame used here may have a circular shape or a rectangular shape. The material therefor is not particularly limited, and it may be made of, for example, metals such as aluminium alloys and stainless steel, plastics such as polyethylene, ceramics such as silicon carbide and alumina, or the like.

The adhesion between the pellicle membrane and the pellicle frame can be achieved by, for example, providing an adhesive layer on the pellicle frame, bringing this adhesive layer into contact with the pellicle membrane, and subjecting them to a heat treatment.

After the pellicle frame is adhered on the pellicle membrane as described above, the final product, pellicle, can be obtained by trimming the pellicle membrane along the outer periphery of the pellicle frame.

According to the present invention, after detaching the pellicle which is the final product, an unnecessary pellicle membrane portion can be cut along the inner periphery of the adhesive layer of the jig for producing a pellicle, and the jig as it is can be used again as the jig for producing a pellicle.

That is, in the subsequent pellicle production, another pellicle as the a final product can be obtained by heating the jig having a pellicle membrane adhered on the upper surface of the adhesive layer again, bringing the adhesive layer having the pellicle membrane into contact with a new pellicle membrane, pressurizing them to obtain adhesion between the adhesive layer and the new pellicle membrane, adhering the pellicle frame to the new pellicle membrane, and trimming the new pellicle membrane along the outer periphery of the pellicle frame.

In the method for producing the pellicle of the present invention, the jig for producing a pellicle can be repeatedly used as described above. However, the adhesive layer may be gradually deformed because the pellicle membranes are stacked on the adhesive layer, because the adhesive layer may be pressurized while it is heated to a temperature higher than its glass transition temperature, and the like. Therefore, the shape of the adhesive layer is preferably corrected once per 10 to 1000 times of the pellicle production.

EXAMPLES

The present invention will be explained hereinafter with reference to the following examples and comparative examples.

Example 1

On a surface-polished silicon single crystal wafer substrate of 250 mm φ, a spin coat layer was formed by a spin coater using a solution of a cyclic polymer of perfluorovinyl ether, Cytop (trade name of Asahi Glass Co., Ltd., glass transition temperature: 108° C.) dissolved in a solvent, CTsolv 180 (trade name of Asahi Glass Co., Ltd.). Then, this substrate was dried by heating at 180° C. for 10 minutes using a hot plate so that the solvent in the spin coat layer should be completely evaporated to form a membrane of fluorocarbon resin (pellicle membrane).

On the other hand, a jig for producing a pellicle comprising a support frame 2 composed of aluminum and having a circular opening 1, and an adhesive layer 3 formed from the aforementioned fluorocarbon resin, Cytop (glass transition temperature: 108° C., trade name of Asahi Glass Co., Ltd.) was separately provided (see FIG. 1).

The adhesive layer 3 of the aforementioned jig for producing a pellicle was brought into contact with the fluorocarbon resin membrane (pellicle membrane) on the substrate placed on the hot plate, and the pellicle membrane and the adhesive layer 3 of the jig for producing a pellicle were adhered under the conditions of 180° C. and 1 kgf load for 1 minute.

Then, force was applied so that a handle 4 of the jig for producing a pellicle should be detached from the substrate in a cantilever fashion to peel off the membrane. As a result, a fluorocarbon resin membrane (pellicle membrane) adhered to and held on the adhesive layer 3 of the jig for producing a pellicle was obtained. This pellicle membrane was adhered onto a pellicle frame in a rectangular shape of 150 mm×120 mm, and the pellicle membrane was trimmed along the outer periphery of the pellicle frame and detached to complete a pellicle as the final product.

On the other hand, the pellicle membrane other than the detached pellicle was left on the jig for producing a pellicle. After cutting off this remained pellicle membrane along the inner periphery of the adhesive layer of the jig for producing a pellicle, the jig was used again as the jig for producing a pellicle of the present invention.

Working time of about 1 minute was required for cutting off the remained pellicle membrane along the inner periphery of the adhesive layer.

When the aforementioned jig for producing a pellicle was repeatedly used 100 times, no generation of fault such as adhesion fault and peeling fault was observed.

Example 2

On a synthetic quartz substrate in a tetragonal shape of 200 mm×200 mm, Cytop (trade name of Asahi Glass Co., Ltd., glass transition temperature: 108° C.) dissolved in a solvent, CTsolv 180 (trade name of Asahi Glass Co., Ltd.), was spin-coated as a fluorocarbon resin solution. Then, this synthetic quartz substrate having the spin coat layer was dried by heating at 180° C. for 10 minutes using a hot plate so that the solvent in the spin coat layer should be completely evaporated to form a membrane of fluorocarbon resin (pellicle membrane).

On the other hand, a jig for producing a pellicle comprising a support frame 2 composed of aluminum and having such a square opening 1 as shown in FIG. 2, and an adhesive layer 3 formed from the aforementioned fluorocarbon resin, Cytop (glass transition temperature: 108° C., trade name of Asahi Glass Co., Ltd.) was separately provided.

The adhesive layer 3 of the aforementioned jig for producing a pellicle was brought into contact with the fluorocarbon resin membrane (pellicle membrane) on the substrate placed on the hot plate, and the pellicle membrane and the adhesive layer 3 of the jig for producing a pellicle were adhered under the conditions of 150° C. and 3 kgf load for 3 minutes.

Then, force was applied so that two of handles 4, 4 of the jig for producing a pellicle should be detached from the substrate to peel off the membrane. As a result, a fluorocarbon resin membrane (pellicle membrane) adhered to and held on the adhesive layer 3 of the jig for producing a pellicle was obtained. This pellicle membrane was adhered onto a pellicle frame in a rectangular shape of 150 mm×120 mm, and the pellicle membrane was trimmed along the outer periphery of the pellicle frame and detached to complete a pellicle as the final product.

On the other hand, the pellicle membrane other than the detached pellicle was left on the jig for producing a pellicle. After cutting off this remained pellicle membrane along the inner periphery of the adhesive layer of the jig for producing a pellicle, the jig was used again as the jig for producing a pellicle of the present invention.

Working time of about 1 minute was required for cutting off the remained pellicle membrane along the inner periphery of the adhesive layer.

When the aforementioned jig for producing a pellicle was repeatedly used 100 times, no generation of fault such as adhesion fault and peeling fault was observed.

Comparative Example

On a surface-polished silicon single crystal wafer substrate of 250 mm φ, a pellicle membrane composed of a fluorocarbon resin was formed in the same manner using the same materials as in Example 1.

Figure 3:
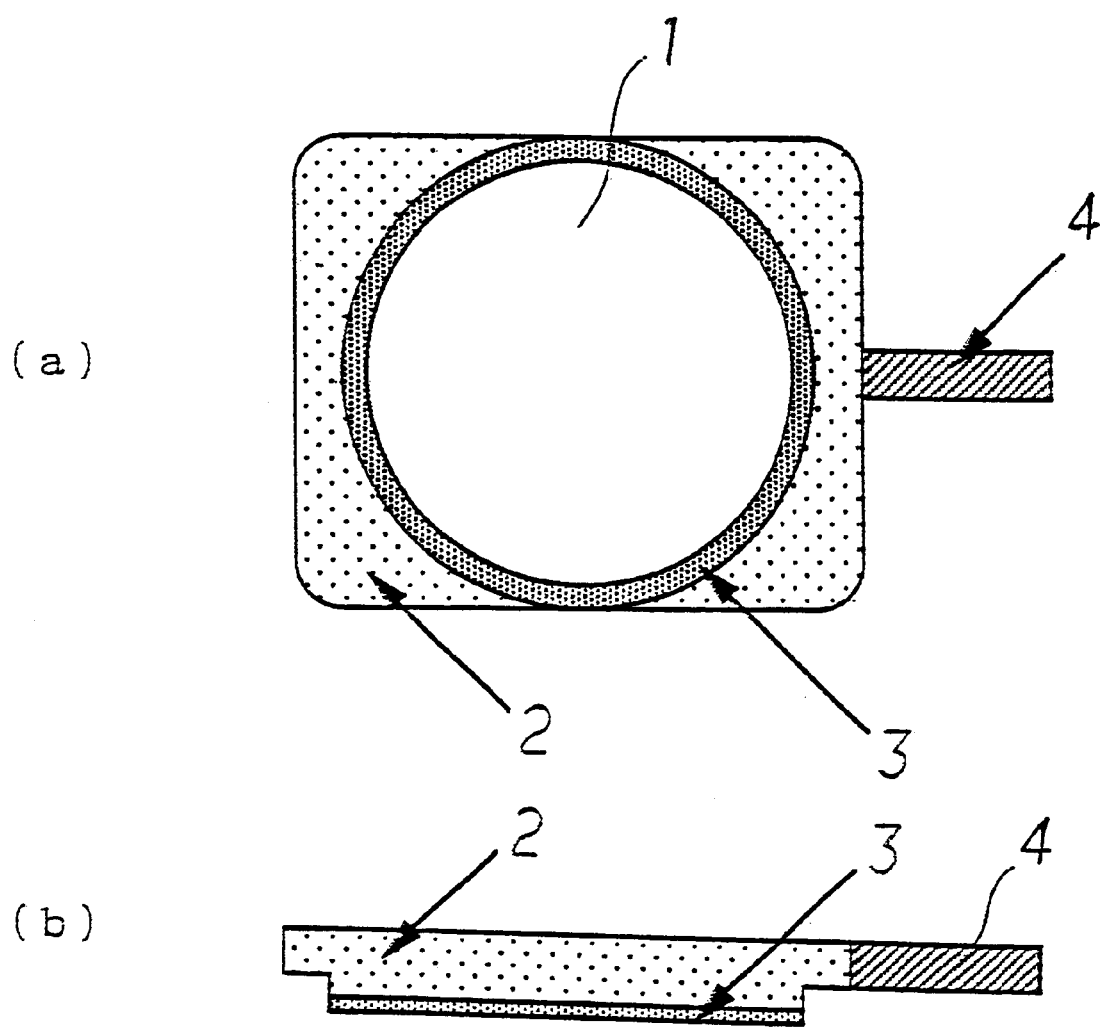
FIG. 3 shows an exemplary conventional jig for producing a pellicle. (a) is a schematic plan view thereof, and (b) is a schematic side view thereof.

On the other hand, a jig for producing a pellicle comprising a support frame 2 composed of stainless steel and having such a circular opening 1 as shown in FIG. 3, and an adhesive layer 3 composed of a double-sided adhesive tape was separately provided.

Then, the substrate on which the pellicle membrane was formed was transferred from the hot plate onto another flat surface plate, and cooled to room temperature. The adhesive layer 3 composed of a double-sided adhesive tape of the aforementioned jig for producing a pellicle was brought into contact with the pellicle membrane on the substrate, and the pellicle membrane and the adhesive layer 3 of the jig for producing a pellicle were adhered under the conditions of room temperature and 10 kgf load for 1 minute.

Then, force was applied so that a handle 4 should be detached from the substrate in a cantilever fashion to peel off the membrane. As a result, a fluorocarbon resin membrane (pellicle membrane) adhered to and held on the adhesive layer 3 of the jig for producing a pellicle was obtained. A pellicle frame in a rectangular shape of 150 mm×120 mm was adhered to this pellicle membrane, and the pellicle membrane was trimmed along the outer periphery of the pellicle frame and detached to complete a pellicle as the final product.

On the other hand, the pellicle membrane other than the detached pellicle was remained on the jig for producing a pellicle. After peeling off the adhesive layer 3 composed of a double-sided adhesive tape, which had the adhered pellicle membrane, to remove it, a double-sided adhesive tape piece cut into a predetermined shape was adhered to the support flame 2 of the jig for producing a pellicle to reform the adhesive layer 3, and the jig was used again as the jig for producing a pellicle.

Working time of about 10 minutes was required for reforming the adhesive layer composed of a double-sided adhesive tape.

The present invention is not limited to the embodiments mentioned above. The above-described embodiments are mere examples, and those having the substantially same structure as that described in the appended claims and providing similar functions and advantages are included in the scope of the present invention.

What is claimed is:

1. A method for producing a pellicle, which comprises the steps of:

forming a pellicle membrane, adhering the formed pellicle membrane to an adhesive layer of a jig for producing a pellicle by heating the pellicle membrane and/or the adhesive layer to a temperature more than their glass transition temperatures and contacting them with each other, so that the pellicle membrane should be held on the adhesive layer, adhering a pellicle frame on the pellicle membrane held on the adhesive layer, wherein the jig comprises a support frame having an opening, and the adhesive layer is provided at a periphery of the opening, and wherein the adhesive layer is composed of a polymer material having a glass transition temperature within a range of 0° C. to 300° C., and trimming the pellicle membrane along outer periphery of the pellicle frame.

2. The method of claim 1, wherein the polymer material used for the adhesive layer of the jig is selected so that a value obtained by subtracting a glass transition temperature of the polymer material of the adhesive layer from a glass transition temperature of a polymer material of pellicle membrane used for the pellicle to be produced should be less than 60° C.

3. The method of claim 1, wherein the polymer material of the adhesive layer of the jig is a polymer material having compatibility with the polymer material of the pellicle membrane.

4. The method of claim 2, wherein the polymer material of the adhesive layer of the jig is a polymer material having compatibility with the polymer material of the pellicle membrane.

5. The method of claim 3, wherein the polymer material of the adhesive layer of the jig is the same material as the polymer material of the pellicle membrane.

6. The method of claim 4, wherein the polymer material of the adhesive layer of the jig is the same material as the polymer material of the pellicle membrane.

7. The method of claim 1, wherein the polymer material used for the adhesive layer of the jig is a fluorocarbon resin.

8. The method of claim 2, wherein the polymer material used for the adhesive layer of the jig is a fluorocarbon resin.

9. The method of claim 3, wherein the polymer material used for the adhesive layer of the jig is a fluorocarbon resin.

10. The method of claim 4, wherein the polymer material used for the adhesive layer of the jig is a fluorocarbon resin.

11. The method of claim 5, wherein the polymer material used for the adhesive layer of the jig is a fluorocarbon resin.

12. The method of claim 6, wherein the polymer material used for the adhesive layer of the jig is a fluorocarbon resin.

* * * * *